(12) United States Patent
Wirth et al.

(10) Patent No.: US 7,663,150 B2
(45) Date of Patent: Feb. 16, 2010

(54) OPTOELECTRONIC CHIP

(75) Inventors: Ralph Wirth, Pettendorf-Adlersberg (DE); Klaus Streubel, Laaber (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 31 days.

(21) Appl. No.: 11/485,784

(22) Filed: Jul. 13, 2006

(65) Prior Publication Data

US 2007/0023774 A1    Feb. 1, 2007

(30) Foreign Application Priority Data

Jul. 14, 2005    (DE) ................ 10 2005 033 005

(51) Int. Cl.
*H01L 29/02* (2006.01)

(52) U.S. Cl. .............. 257/95; 257/98; 257/99; 257/94; 257/E33.068; 257/E33.067; 257/E33.072; 257/E51.021; 438/29; 438/42; 438/25; 438/26; 438/455; 438/458; 438/27

(58) Field of Classification Search .......... 257/79, 257/95
See application file for complete search history.

(56) References Cited

U.S. PATENT DOCUMENTS

| 3,954,534 | A | | 5/1976 | Scifres et al. |
| 5,633,527 | A | * | 5/1997 | Lear ............................ 257/432 |
| 6,252,219 | B1 | | 6/2001 | Abe |
| 6,641,287 | B2 | * | 11/2003 | Suehiro ..................... 362/298 |
| 6,995,030 | B2 | | 2/2006 | Illek et al. |
| 2002/0084462 | A1 | * | 7/2002 | Tamai et al. .................. 257/79 |
| 2002/0141006 | A1 | | 10/2002 | Pocius et al. |
| 2005/0056856 | A1 | | 3/2005 | Yamazaki et al. |
| 2005/0121683 | A1 | * | 6/2005 | Nakata ........................ 257/99 |
| 2005/0258446 | A1 | * | 11/2005 | Raos et al. ................... 257/99 |

FOREIGN PATENT DOCUMENTS

| DE | 25 43 471 | | 5/1976 |
| DE | 102 13 611 | A1 | 10/2002 |
| EP | 1 221 722 | A1 | 1/2001 |
| GB | 1 195 547 | | 6/1970 |
| GB | 2 145 281 | A | 3/1985 |
| JP | 55162284 | | 12/1980 |
| JP | 03085774 | | 4/1991 |
| WO | WO 02/13281 | A1 | 2/2002 |
| WO | WO 02/071104 | A2 | 9/2002 |

OTHER PUBLICATIONS

Gerthsen, Knesser, Vogel, "PHYSIK", Ein Lehrbuch zum Gebrauch neben Vorlesungen, Springer-Verlag Berlin, pp. 423-438, 1982.

* cited by examiner

*Primary Examiner*—Minh-Loan T Tran
*Assistant Examiner*—Fei Fei Yeung Lopez
(74) *Attorney, Agent, or Firm*—Cohen Pontani Lieberman & Pavane LLP (57) ABSTRACT

An optoelectronic chip having a semiconductor body (14), which contains a radiation-emitting region (2), and a partial region (3) in which the surface (13) of the semiconductor body (14) is curved convexly toward a carrier (10). The lateral extent (2r) of the radiation-emitting region (2) is less than the lateral extent (2R) of the partial region (3). A method for producing such a chip is also described.

23 Claims, 7 Drawing Sheets

OPTOELECTRONIC CHIP

RELATED APPLICATIONS

This patent application claims the priority of German patent application 102005033005.3-33 filed Jul. 14, 2005, the disclosure content of which is hereby incorporated by reference.

FIELD OF THE INVENTION

An optoelectronic chip is specified. Moreover, a method for producing such a chip is specified.

BACKGROUND OF THE INVENTION

U.S. Pat. No. 6,995,030 describes a light-emitting semiconductor chip and a method for producing it.

SUMMARY OF THE INVENTION

One object of the present invention is to provide an optoelectronic chip having a particularly high radiation coupling-out efficiency.

A further object of the present invention is to provide an optoelectronic chip in which a particularly large proportion of the electromagnetic radiation generated is coupled out into a specific solid angle range.

In accordance with at least one embodiment of the optoelectronic chip, the optoelectronic chip has a semiconductor body. The semiconductor body comprises, by way of example, an epitaxial semiconductor layer sequence deposited onto a growth substrate. The layer sequence preferably comprises an active zone suitable for generating electromagnetic radiation. The active zone may be provided, by way of example, by one or more layers of the semiconductor layer sequence. The active zone preferably comprises a pn junction, a double heterostructure, a single quantum well structure or a multiple quantum well structure.

The growth substrate is preferably thinned or completely removed from the semiconductor body. The semiconductor body is then a so-called thin-film layer.

In accordance with at least one embodiment of the optoelectronic chip, the active zone has a radiation-emitting region. The radiation-emitting region is formed, by way of example, by a part of the active zone. It is only in this partial region of the active zone that electromagnetic radiation is generated during operation of the optoelectronic chip. The radiation-emitting region is produced for example by damaging the active zone apart from the radiation-emitting region in such a way that only the radiation-emitting region is now suitable for generating electromagnetic radiation during operation of the optoelectronic chip. However, it is also possible for the semiconductor body to be formed in such a way that, during operation, only the radiation-emitting region is energized and, therefore, generation of radiation takes place only in this region of the active zone. A combination of the two measures—that is to say damaging the active zone apart from the radiation-emitting region and energizing only the radiation-emitting region—is also possible.

In accordance with at least one embodiment of the optoelectronic chip, the semiconductor body has a partial region in which the surface of the semiconductor body is curved convexly toward a carrier. That is to say that the surface of the semiconductor body has a convex curvature at least in a partial region of the semiconductor body. Said partial region is patterned into the surface of the semiconductor body, by way of example. That is to say that the partial region is patterned into the epitaxially grown semiconductor body. By way of example, an etching technique may be used for this purpose. The surface of the semiconductor body which has the convex partial region faces a carrier. At said surface, the semiconductor body is mechanically fixedly connected to the carrier, by way of example. The surface having the partial region that is curved convexly toward the carrier is preferably that surface of the semiconductor body that is originally remote from the growth substrate.

The carrier can be chosen relatively freely compared with the growth substrate. Thus, the carrier may be better suited to the chip with regard to many properties such as conductivity or mechanical stability, for instance, than available growth substrates, which are subject to narrow restrictions for producing high-quality epitaxial layers. Thus, in order to obtain high-quality epitaxial layers, the epitaxially deposited material has to be lattice-matched to the growth substrate, by way of example.

The carrier is preferably distinguished by a coefficient of thermal expansion that is adapted to the semiconductor body. By way of example, the carrier may contain a semiconductor material such as germanium, gallium arsenide, gallium nitride, silicon carbide and other materials such as sapphire, molybdenum, metals or carbon. Furthermore, the carrier is preferably distinguished by a particularly good thermal conductivity, so that the heat arising during the generation of electromagnetic radiation in the active zone of the semiconductor body can be dissipated at least partly via the carrier to the surroundings.

In accordance with at least one embodiment of the optoelectronic chip, the radiation-emitting region has a smaller lateral extent than the convexly curved partial region.

In this case, "lateral extent of the radiation-emitting region" is understood to be the maximum extent of the radiation-emitting region in a plane of the semiconductor body which runs perpendicular or substantially perpendicular to the growth direction of the semiconductor body. By way of example, said plane runs parallel to the surface of the carrier that faces the semiconductor body. The "lateral extent of the convexly curved partial region" correspondingly designates the maximum extent of the partial region in a plane running perpendicular or substantially perpendicular to the growth direction of the semiconductor body. Preferably, the lateral extent of the convexly curved partial region is at least twice as large as the lateral extent of the radiation-emitting region, particularly preferably at least three times as large.

In accordance with at least one embodiment of the optoelectronic chip, the chip has a semiconductor body with a radiation-emitting region and a partial region in which the surface of the semiconductor body is curved convexly toward a carrier, the lateral extent of the radiation-emitting region being less than the lateral extent of the partial region.

In accordance with at least one embodiment of the optoelectronic chip, at least one reflective layer is arranged between the semiconductor body and the carrier. The reflective layer may comprise, by way of example, a Bragg mirror or a metal-containing mirror layer. A metal-containing reflective layer or layer sequence, which may contain gold, gold-germanium, silver, aluminum or platinum, by way of example, is distinguished by lower directional dependence of the reflectivity by comparison with a Bragg mirror. Moreover, with metal-containing mirrors it is possible to achieve a higher reflectivity than with Bragg mirrors. It is furthermore possible for the reflective layer sequence to comprise a reflective metal layer or layer sequence and a layer which contains a dielectric material.

The reflective layer or layer sequence arranged between the carrier and the semiconductor body is particularly preferably suitable for reflecting the electromagnetic radiation generated by the radiation-emitting region during operation of the optoelectronic chip.

In accordance with at least one embodiment of the optoelectronic chip, the reflective layer covers the convexly curved partial region at least in places. That is to say that the surface of the semiconductor body is covered with the reflective layer or layer sequence at least in places, at least where the convexly curved partial region is situated.

In this case, the optoelectronic chip described makes use of the idea, inter alia, that the convexly curved partial region covered with a reflective layer functions as a mirror for the radiation generated in the radiation-emitting region. With the aid of the shaping of the partial region, the emission characteristic of the reflected radiation and thus the emission characteristic of the chip can be set in a defined manner, by way of example. The direction in which the radiation is reflected can thus be set, by way of example.

In accordance with at least one embodiment, the semiconductor body has a multiplicity of radiation-emitting regions. That is to say that a plurality of regions of the active zone of the semiconductor body are suitable for generating electromagnetic radiation during operation of the optoelectronic chip. The radiation-emitting regions may be arranged for example in a regular pattern at substantially identical distances from one another in the active zone. Preferably, all the radiation-emitting regions are substantially of the same size in this case, that is to say that all the radiation-emitting regions have, by way of example, substantially the same lateral extent.

In this case, "substantially the same lateral extent" means that fluctuations in the extent and arrangement of the radiation-emitting regions are possible due to production or on account of undesired inhomogeneities in the semiconductor body.

By way of example, the radiation-emitting regions may be produced by damaging the active zone so that only those regions of the active zone which are not damaged are suitable for generating radiation during operation of the optoelectronic chip.

In accordance with at least one embodiment of the optoelectronic chip, a convexly curved partial region of the semiconductor body is assigned to each radiation-emitting region. "Assigned" means that electromagnetic radiation generated in the radiation-emitting region impinges for the most part on the convexly curved surface of the semiconductor body in the assigned partial region and hardly any or no radiation at all from said radiation-generating region impinges on the surface of other, for example adjacent, partial regions. In this case, it is possible for a common partial region to be assigned to a plurality of radiation-emitting regions.

Preferably, precisely one partial region is assigned to each radiation-emitting region and precisely one radiation-emitting region is assigned to each partial region. That is to say that the radiation-emitting regions are assigned one-to-one to the convexly curved partial regions. By way of example, the radiation-emitting regions are then arranged in a centered manner with respect to the convexly curved partial region assigned one-to-one.

In accordance with at least one embodiment, the convexly curved partial region forms a concave mirror for at least one part of the electromagnetic radiation generated in the assigned radiation-emitting region. This is realized for example by the convexly curved partial region—as already described further above—being covered with a reflective layer or layer sequence at least in places. That is to say, by way of example, that a reflective layer or layer sequence is provided on the surface of the semiconductor body that faces the carrier. The form of the concave mirror is determined by the form of the convexly curved partial region.

In accordance with at least one embodiment of the optoelectronic chip, the radiation-emitting region assigned to a partial region is arranged, at least in places, in the focal plane of said concave mirror. That is to say that the radiation-emitting region is preferably arranged, at least in places, at the focal point of the concave mirror. That is to say that at least one part of the radiation-emitting region is situated at the focal point of a concave mirror which is formed by a reflectively coated partial region of the semiconductor body.

In accordance with at least one embodiment of the optoelectronic chip, at least one of the partial regions has a parabolic curvature at least in places. The reflectively coated partial region then preferably forms a parabolic mirror for the electromagnetic radiation generated in the assigned radiation-emitting region.

In accordance with at least one embodiment of the optoelectronic chip, at least one of the partial regions has a spherical curvature at least in places. That is to say that the partial region is curved in the manner of a sphere at least in places. The partial region may then be formed by a hemisphere made of semiconductor material, by way of example.

In accordance with at least one embodiment of the optoelectronic chip, at least one of the partial regions has an aspherical curvature. That is to say that the partial region is aspherically curved at least in places. Through the curvature of the partial region, it is possible to set the optical properties of the concave mirror formed by the partial region.

In this case, the optoelectronic chip described makes use of the idea, inter alia, that the emission characteristic and the emission direction of the electromagnetic radiation generated by the optoelectronic chip can be set in a targeted manner by way of the curvature of the partial region configured in reflective fashion. Thus, the curvature of the partial region may bring about the effect, by way of example, that a particularly large proportion of the electromagnetic radiation generated is reflected into a specific solid angle range in a targeted manner. This advantageously increases the coupling-out efficiency in this spatial range.

In accordance with at least one embodiment of the optoelectronic chip, the surface of the semiconductor body that is remote from the carrier has at least one region that is patterned in such a way that it forms a lens for the electromagnetic radiation generated by the radiation-emitting region during the operation of the chip.

In accordance with at least one embodiment of the optoelectronic chip, a lens is arranged downstream of the radiation-emitting region. In this case, a lens is understood to be, by way of example, an optical element suitable for refracting in a defined manner electromagnetic radiation that passes through the optical element. However, it is also possible for the lens to be suitable for diffracting electromagnetic radiation. Furthermore, it is possible for the lens to be suitable both for refracting light and for diffracting light. The lens is preferably arranged downstream of the radiation-emitting region in such a way that at least one part of the electromagnetic radiation generated in the radiation-emitting region passes through the lens and can be refracted and/or diffracted by the latter. The lens may furthermore also be provided for improving the coupling-out probability of electromagnetic radiation from the chip. By means of the shaping of the lens and the arrangement of the lens relative to the radiation-emitting region, it is advantageously possible to reduce the probability of total reflection when radiation emerges from the chip. By way of example, the lens may for this purpose have the form of a hemisphere, the radiation-emitting region being situated at the midpoint of the sphere.

The lens is preferably formed by at least one partial region of the semiconductor body. That is to say that at least one region of the semiconductor body is patterned in such a way that it is suitable for refracting and/or diffracting electromagnetic radiation generated in the radiation-emitting region. By way of example, the lens may be formed by a patterned region of the surface of the semiconductor body.

The patterned region of the semiconductor body may have a defined curvature, by way of example. The lens may then be delimited by this part of the surface, by way of example. Electromagnetic radiation which passes through the curved partial region of the surface from the semiconductor body is then refracted for example according to the laws of geometrical optics.

In accordance with at least one embodiment of the optoelectronic chip, the lateral extent of the lens is greater than the lateral extent of the radiation-emitting region. The lateral extent of the lens is understood to be, by way of example, the maximum extension of the lens in a plane perpendicular to the growth direction of the epitaxial layer sequence. The lateral extent of the lens is preferably at least twice as large as the lateral extent of the radiation-emitting region. The lateral extent of the lens is particularly preferably at least three times as large as the lateral extent of said region.

In accordance with at least one embodiment of the optoelectronic chip, precisely one lens is assigned to each radiation-emitting region. The electromagnetic radiation generated in the radiation-emitting region then predominantly emerges from the chip through the lens assigned to the region. Hardly any electromagnetic radiation generated in the radiation-emitting region, or none at all, emerges through other, for example adjacent, lenses in this case.

In accordance with at least one embodiment of the optoelectronic chip, precisely one lens is assigned to each radiation-emitting region and precisely one radiation-emitting region is assigned to each lens. That is to say that preferably a lens is assigned one-to-one to each radiation-emitting region. The radiation-emitting region and the assigned lens are particularly preferably arranged in a centered manner with respect to one another. The lens is then preferably also arranged in a centered manner with respect to the convexly curved partial region of the semiconductor body which is assigned one-to-one to the radiation-emitting region. That is to say that lens, partial region curved convexly toward a carrier and radiation-emitting region are then preferably assigned one-to-one to one another in pairs.

In accordance with at least one embodiment of the optoelectronic chip, the lens is patterned by means of an etching technique into that surface of the semiconductor body which is remote from the carrier. The semiconductor body then forms an outwardly curved volume lens in this region. The lens may have a spherical curvature or an aspherical curvature, by way of example. However, it is also possible for the lens to be a Fresnel lens.

In accordance with at least one embodiment of the optoelectronic chip, at least one part of the radiation-emitting region is arranged at the midpoint of a sphere made of semiconductor material which is formed by patterning the surface of the semiconductor body facing the carrier and the surface of the semiconductor body remote from the carrier. For this purpose, by way of example, spherically curved, convex regions are formed on the two surfaces of the semiconductor body that are remote from one another, said regions complementing one another to form a sphere. In this case, the convexly curved partial region facing the carrier is preferably configured in reflective fashion, that is to say that the partial region is coated reflectively at least in places. The convexly curved regions are preferably patterned into the semiconductor body by means of an etching technique. Both the surface of the semiconductor body facing the carrier and the surface of the semiconductor body remote from the carrier then have curved etched structures.

In this case, a semiconductor chip patterned in this way makes use of the idea, inter alia, of arranging a radiation source—the radiation-emitting region—in the interior—preferably at the midpoint—of a sphere made of semiconductor material. The following preferably holds true for the lateral extent of the radiation-emitting region:

$$r < R\, n_2/n_1$$

where R denotes the radius of the sphere made of semiconductor material, $n_2$ denotes the refractive index of the medium adjoining the radiation exit area of the optoelectronic chip, and $n_1$ denotes the refractive index of the material from which the sphere is formed.

A method for producing an optoelectronic chip is furthermore specified.

In accordance with at least one embodiment of the method, firstly a semiconductor body is deposited preferably epitaxially onto a growth substrate. The semiconductor body preferably comprises at least one active zone formed by a layer or layer sequence of the semiconductor body. The active zone has, by way of example, a pn junction, a double heterostructure, a quantum well structure or a multiple quantum well structure for generating electromagnetic radiation.

Filler layers are part of the semiconductor boy and are deposited on the side of the active zone facing the growth substrate and/or the side of the active zone remote from the growth substrate, and convexly curved regions can subsequently be patterned into said filler layers.

In accordance with at least one embodiment of the method, at least one partial region that is curved convexly away from the substrate is produced by means of patterning the surface of the filler layer of the semiconductor body that is remote from the substrate. By way of example, the surface is patterned by means of an etching technique into a filler layer remote from the substrate. A multiplicity of such partial regions are preferably produced on the surface of the semiconductor body.

In accordance with at least one embodiment of the method, radiation-emitting regions whose lateral extent is less than the lateral extent of the convexly curved partial regions are produced in the active zone. The radiation-emitting regions may be produced for example by one of the following methods:
proton implantation, quantum well intermixing, oxidation of a high-aluminum-containing layer.

In accordance with at least one embodiment of the method, in a further method step, a carrier is applied to the surface of the semiconductor body that is remote from the substrate. By way of example, the carrier may be bonded onto the substrate. That is to say that the convexly curved partial regions on the surface of the semiconductor body face the carrier.

In accordance with at least one embodiment of the method for producing an optoelectronic chip, the method comprises the following steps of depositing a semiconductor body comprising an active zone on a substrate, producing at least one partial region that is curved convexly away from the substrate by means of patterning the surface of the semiconductor body that is remote from the substrate, producing a radiation-emitting region in the active zone, the lateral extent of said radiation-emitting region being less than the lateral extent of the partial region, and applying a carrier to the surface of the semiconductor body that is remote from the substrate.

The enumerated order of individual method steps does not necessarily have to be complied with in the method described. By way of example, producing the radiation-emitting regions may also take place after applying a carrier to the surface of the semiconductor body that is remote from the substrate.

In accordance with at least one embodiment of the method, the substrate is thinned after the carrier has been applied. That is to say that the thickness of the substrate is reduced for example by means of one of the following techniques: etching, sawing, grinding.

In accordance with at least one embodiment, the substrate is completely removed from the semiconductor body. By way of example, the substrate is removed by means of one of the following techniques: etching, sawing, grinding, laser ablation. The semiconductor body is free of a growth substrate in this case.

In accordance with at least one embodiment of the method, a region that is curved convexly away from the carrier is produced on the surface of the semiconductor body that is remote from the carrier, by patterning the surface. In this case, the surface is patterned by means of an etching technique, by way of example. The region preferably forms one of the following optical elements: spherical volume lens, aspherical volume lens, Fresnel lens. That is to say that at least one lens is produced on the surface of the semiconductor body which is remote from the carrier. A multiplicity of such regions are preferably produced by means of the method. A radiation-emitting region in the active zone is preferably assigned one-to-one to each region.

In accordance with at least one embodiment of the method, radiation-emitting regions are produced in the active zone by damaging at least one part of the active zone. That is to say that parts of the active zone are damaged in such a way that they are no longer suitable for generating electromagnetic radiation. Undamaged regions of the active zone then form the radiation-emitting regions. A multiplicity of radiation-emitting regions are preferably produced in this way. A convexly curved partial region facing the carrier is particularly preferably assigned one-to-one to each radiation-emitting region.

DETAILED DESCRIPTION OF THE DRAWINGS

In the exemplary embodiments and Figures, identical or identically acting constituent parts are in each case provided with the same reference symbols. The elements illustrated in the Figures are not to be regarded as true to scale. Rather, in order to afford a better understanding, individual elements in the Figures may be illustrated in part with an exaggerated size and not in the actual size relation with respect to one another.

Figure 1:
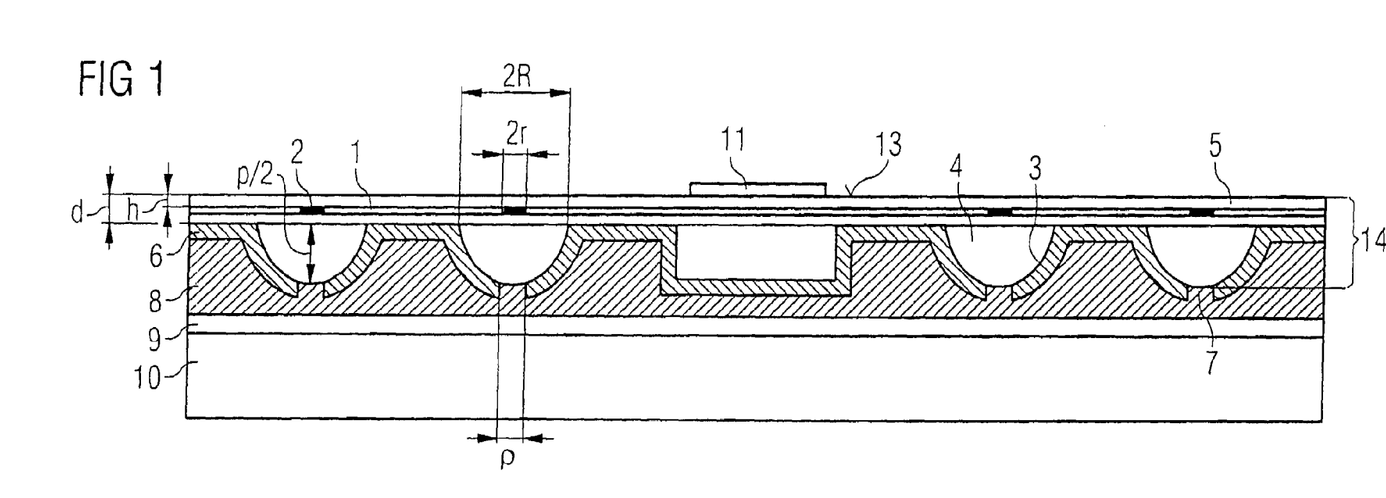
FIG. 1 shows a schematic sectional illustration of a first exemplary embodiment of the optoelectronic chip.

FIG. 1 shows a schematic sectional illustration of a first exemplary embodiment of the optoelectronic chip described here.

In this exemplary embodiment, a semiconductor body 14, which comprises a thin-film layer for example, is arranged on the carrier 10. The carrier 10 may be a wafer, by way of example. By way of example, the carrier may contain at least one of the following materials: germanium, gallium arsenide, gallium nitride, silicon carbide, sapphire, molybdenum, metals, carbon.

It is also possible for the carrier to be formed by a flexible electrically conductive film. By way of example, the carrier may be a carbon film. In this case, the thickness of the film is preferably less than or equal to 100 µm.

The carrier is preferably mechanically connected and electrically contact-connected to the semiconductor body 14 by means of a bonding layer 9. An electrically insulating dielectric layer 6 is preferably applied to that surface of the semiconductor body 14 which faces the carrier 10. The dielectric layer 6 contains, by way of example, one of the following materials: a silicon nitride, a silicon oxide, an aluminum oxide. The dielectric layer 6 preferably comprises $Si_3N_4$ or SiN or contains these materials.

A reflective metal layer 8 is arranged between the dielectric layer 6 and the carrier 10. The reflective metal layer 8 contains, by way of example, a reflective metal such as gold, silver, gold-germanium, aluminum or platinum.

The reflective metal layer 8 preferably has particularly good electrical conductivity, on the one hand, and is suitable, on the other hand, for reflecting the electromagnetic radiation generated in radiation-emitting regions 2 of the active zone 1 of the semiconductor body 14 at least partly in the direction of the surface 13 of the semiconductor body 14.

The dielectric layer 6 has perforations which form the current coupling-in regions 7. In this case, the perforations preferably contain the material of the reflective metal layer 8 which directly adjoins the semiconductor body 14 in the perforations. The current coupling-in regions 7 have a lateral extent p, by way of example. They may be formed in cylindrical fashion, by way of example. The lateral extent p is then given by the diameter of this cylinder.

The semiconductor body 14 is based for example on nitride compound semiconductors, phosphide compound semiconductors or arsenide compound semiconductors.

In the present context, "based on nitride compound semiconductors" means that at least one layer of the active epitaxial layer sequence—for example the active zone 1—comprises a nitride III/V compound semiconductor material, preferably $Al_nGa_mIn_{1-n-m}M$, where $0 \leq n \leq 1$, $0 \leq m \leq 1$ and $n+m \leq 1$. In this case, this material need not necessarily have a mathematically exact composition according to the above formula. Rather, the material may have one or more dopants and additional constituents that do not substantially change the characteristic physical properties of the $Al_nGa_mIn_{1-n-m}N$ material. For the sake of simplicity, however, the above formula only comprises the essential constituents of the crystal lattice (Al, Ga, In, N) even though they may be replaced in part by small quantities of further substances.

In the present context, "based on phosphide compound semiconductors" means that at least one layer of the active epitaxial layer sequence—for example the active zone 1—comprises a phosphide IIIN compound semiconductor material, preferably $Al_nGa_mIn_{1-n-m}P$, where $0 \leq n \leq 1$, $0 \leq m \leq 1$ and $n+m \leq 1$. In this case, this material need not necessarily have a mathematically exact composition according to the above formula. Rather, the material may have one or more dopants and additional constituents that do not substantially change the characteristic physical properties of the $Al_nGa_mIn_{1-n-m}P$ material. For the sake of simplicity, however, the above formula only comprises the essential constituents of the crystal lattice (Al, Ga, In, P) even though they may be replaced in part by small quantities of further substances.

In the present context, "based on arsenide compound semiconductors" means that at least one layer of the active epitaxial layer sequence—for example the active zone 1—comprises an arsenide III/V compound semiconductor material, preferably $Al_nGa_mIn_{1-n-m}As$, where $0 \leq n \leq 1$, $0 \leq m \leq 1$ and $n+m \leq 1$. In this case, this material need not necessarily have a mathematically exact composition according to the above formula. Rather, the material may have one or more dopants and additional constituents that do not substantially change the characteristic physical properties of the $Al_nGa_mIn_{1-n-m}As$ material. For the sake of simplicity, however, the above formula only comprises the essential constituents of the crystal lattice (Al, Ga, In, As) even though they may be replaced in part by small quantities of further substances.

The semiconductor body furthermore preferably has at least one active zone 1 which is suitable for generating electromagnetic radiation. The active zone 1 may have, by way of example, a pn junction, a double heterostructure, a single quantum well structure or a multiple quantum well structure.

In the context of the application, the designation "quantum well structure" encompasses any structure in which charge carriers experience a quantization of their energy states as a result of confinement. In particular, the designation "quantum well structure" does not comprise any indication about the dimensionality of the quantization. It thus encompasses, inter alia, quantum wells, quantum wires and quantum dots and any combination of these structures.

The active zone 1 has radiation-emitting regions 2. The radiation-emitting regions 2 may be produced by damaging the active zone 1 in regions in which generation of radiation is not intended to take place during the operation of the optoelectronic chip. The active zone may be damaged for example by means of proton implantation, oxidation of a high-aluminum-containing layer or quantum well intermixing.

It is furthermore possible for the, for example, p-doped layer of the semiconductor body that faces the carrier to have a low transverse conductivity, so that, when current is coupled in through the current coupling-in regions 7, substantially regions of the active zone 1 are energized which are a perpendicular projection of the current coupling-in regions 7 into the plane of the active zone 1.

The radiation-emitting regions 2 preferably have a lateral extent $2r$. By way of example, the radiation-emitting regions are cylindrical or disk-shaped, the diameter of the cylinder being the lateral extent of the radiation-emitting region. The radiation-emitting regions then have a radius $r$ in each case.

In the exemplary embodiment of FIG. 1, the semiconductor body 14 furthermore contains partial regions 3 which are curved convexly toward the carrier 10. The partial regions 3 are patterned into the filler layer 4 of the semiconductor body 14 by means of an etching technique, by way of example. The partial regions 3 are reflectively coated with the dielectric layer 6 and the metal layer 8 at least in places.

In the exemplary embodiment of FIG. 1, the partial regions 3 are provided by paraboids of the form $y^2=2pz$, where $z$ is the sectional normal and $y$ lies in a plane running parallel to the surface of the carrier 10 to which the semiconductor body 14 is applied. In the exemplary embodiment of FIG. 1, the reflectively coated partial regions 3 act in the sense of parabolic mirrors for the electromagnetic radiation generated in the radiation-emitting region 2.

Preferably, a partial region 3 is assigned one-to-one to each radiation-emitting region 2. Particularly preferably, each radiation-emitting region 2 lies, at least in places, in the focal plane of an assigned parabolic mirror. That is to say that at least parts of the radiation-emitting region 2 lie at the focal point of the parabolic mirror. During operation of the optoelectronic chip, electromagnetic radiation generated in the radiation-emitting region 2 is reflected from the assigned parabolic mirror.

An n-conducting layer 5, for example, which may be provided as a current expansion layer, is situated on that side of the active zone 1 which is remote from the carrier. A bonding pad 11 is applied on the surface 13 of the optoelectronic chip. The layer 5 is preferably suitable for uniformly distributing the current coupled in via the bonding pad 11 over the surface 13 of the optoelectronic chip. As an alternative to this, the semiconductor layer 5 may also be dispensed with. The current distribution from the bonding pad 11 may then be realized by a TCO layer (transparent conductive oxide), which may contain, by way of example, an ITO (indium tin oxide) or a ZnO (zinc oxide). Contact points are then arranged above the radiation-emitting region, that is to say above the focal point of the parabolic mirror.

It is furthermore possible for a respective lens 12 (in this respect, also cf. FIG. 3) to be arranged downstream of the radiation-emitting regions 2, said lens being arranged in a centered manner with respect to the radiation-emitting region, by way of example. The lens may be one of the following lenses: spherical lens, aspherical lens, Fresnel lens. The lens may be patterned into a filler layer 4 of the semiconductor body 14, by way of example, said further layer being situated on that side of the active zone 1 which is remote from the carrier 10.

Figure 2A:
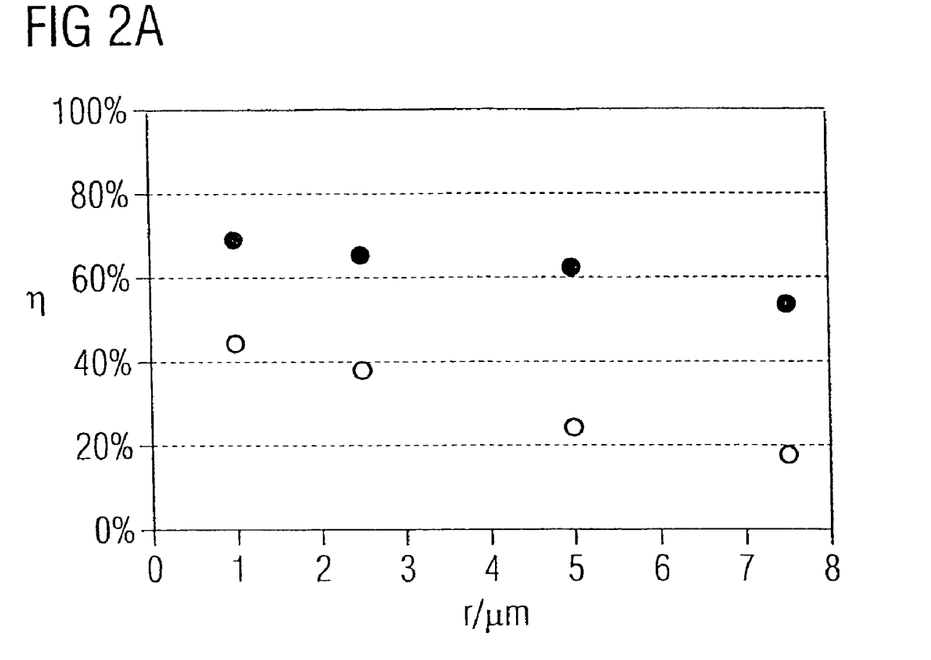
FIG. 2A shows a graphical plotting of the coupling-out efficiency against the radius of the active zone for the first exemplary embodiment of the optoelectronic chip.

FIG. 2A shows calculated values of the coupling-out efficiency $\mu$ in percent for an exemplary embodiment of the optoelectronic chip such as is shown in FIG. 1. The following model parameters are kept constant in this case: the height of the paraboid above the active zone 1 is $p/2=8$ μm. The active zone lies, at least in places, in the focal plane of the paraboid. The radiation-emitting region 2 lies, at least in places, at the focal point of the paraboid. The lateral extent of the paraboid 2R is approximately 4.5 μm.

The layers of semiconductor body 14 other than filler layers 4 are called connecting semiconductor layers.

The thickness $d$ of the connecting semiconductor layer is 2.2 μm, the thickness of the active zone 1 being 0.2 μm. The radiation-emitting region 2 has an internal efficiency for photon recycling of 90 percent and is formed in the AlGaInP semiconductor system defined above. The emission wavelength is 650 nanometers.

The refractive index of the semiconductor body in the AlGaAs/AlGaInP material system is approximately between 3.0 and 3.5. That is to say that the filler layers 4 are formed in the AlGaAs material system.

The refractive index of the material surrounding the chip is 1.5. This corresponds for example to the refractive index of epoxy resin, which may adjoin the surface 13 of the optoelectronic chip as chip encapsulation.

In this exemplary embodiment the dielectric layer 6 comprises a silicon nitride. The metal layer 8 comprises gold.

FIG. 2A shows the coupling-out efficiency $\eta$ in the integral form (filled circles) and into the numerical aperture 0.5 (open circles) as a function of the radius $r$ of the radiation-emitting region 2. The "integral form" of the coupling-out efficiency denotes the coupling-out efficiency integrated over a virtual semi-sphere which spans over the radiation-emitting region 2. This means that rays from every direction emitted by the radiation-emitting region 2 are taken into account for the measurement of the coupling-out efficiency in the integral form. By way of contrast, the expression coupling-out efficiency into the numerical aperture 0.5" means that only the rays which fall into a certain angular range are taken into account. The "numerical aperture 0.5" denotes this angular range. This term is well known to persons ordinarily skilled in this field.

As can be gathered from FIG. 2A, the coupling-out efficiency into a numerical aperture equal to 0.5 is all the greater, the more narrowly the radiation-emitting region 2 is constricted. For a radius of the radiation-emitting region 2 of r approximately 1 µm, that is to say for a lateral extent of approximately 2 µm, a coupling-out efficiency of more than 40 percent into a numerical aperture equal to 0.5 is achieved.

Figure 2B:
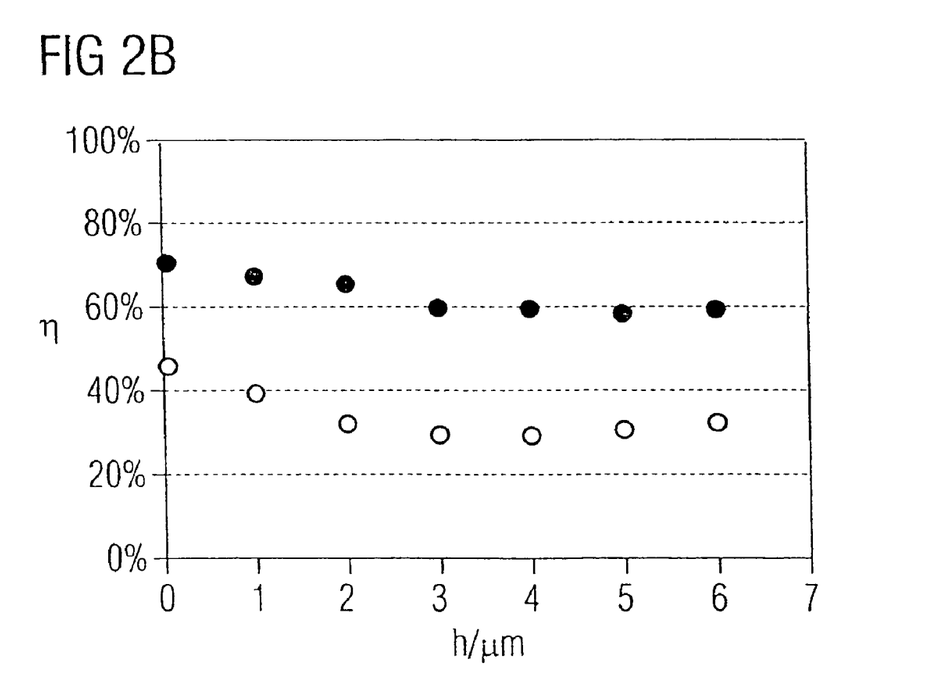
FIG. 2B shows a graphical plotting of the coupling-out efficiency against the distance between the radiation-emitting region and the radiation exit area for the first exemplary embodiment.

FIG. 2B shows the coupling-out efficiency as a function of the thickness h of the semiconductor layer 5. The thickness d of the connecting semiconductor layer is 1.2 µm plus h. The radius r of the radiation-emitting region 2 is fixed at 2.5 µm, and the lateral extent of the radiation-emitting region 2 is thus 5 µm.

As can be gathered from FIG. 2B, both the integral coupling-out efficiency (filled circles) and the coupling-out efficiency into a numerical aperture 0.5 (open circles) rise with reduced thickness h of the semiconductor layer 5. This can be attributed to the fact that rays which are emitted forward and do not lie within the coupling-out cone—that is to say are subjected to total reflection at the surface 13 of the optoelectronic chip—are reflected very near to the radiation-emitting region in the case of a smaller thickness h. The virtual image of the radiation-emitting region 2 which originates from reflections of rays at the surface 13—can also utilize the parabolic mirror. That is to say, the radiation of the virtual image also impinges on the parabolic mirror and is reflected by this mirror.

A preferred exemplary embodiment of the optoelectronic chip therefore dispenses with the semiconductor layer 5. In this case, the current expansion from the bonding pad 11 may be realized by a TCO layer and contact points above the centers of the paraboid.

Figure 3:
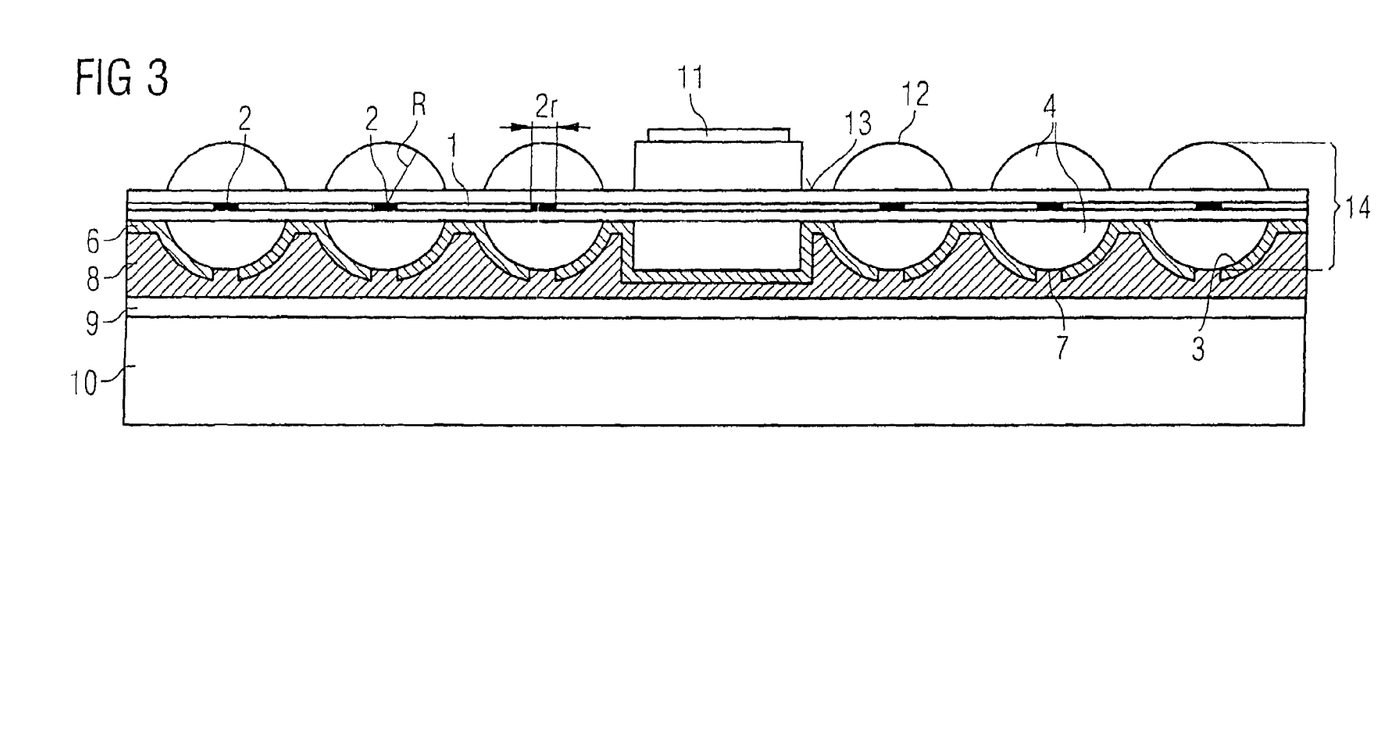
FIG. 3 shows a schematic sectional illustration of a second exemplary embodiment of the optoelectronic chip.

FIG. 3 shows a second exemplary embodiment of the optoelectronic chip described here.

In contrast to the exemplary embodiment of FIG. 1, the partial regions 3 which are curved convexly toward the carrier 10 are spherically curved in this exemplary embodiment. The partial regions 3 are preferably in the form of hemispheres. Furthermore, spherical lenses 12 are patterned into the filler layer 4 on a side of the optoelectronic chip that is remote from the carrier 10.

In this way, the radiation-emitting regions 2 are in each case embedded in spheres having the radius R which comprise semiconductor material.

The optoelectronic chip formed in this way makes use of the principle of the Weierstrass sphere. In the interior of the sphere which is formed by the convexly curved partial region 3 and the spherical lens 12 and has a refractive index $n_1$ and a radius R, the radiation-emitting region 2 is arranged as a light source with a lateral extent 2r. For a disk-shaped radiation-emitting region 2 having a radius r, the result for $r < R \, n_2/n_1$ where $n_2$ is the refractive index of the surrounding medium, is a particularly efficient coupling-out of the electromagnetic radiation generated in the radiation-emitting region 2.

Figure 4:
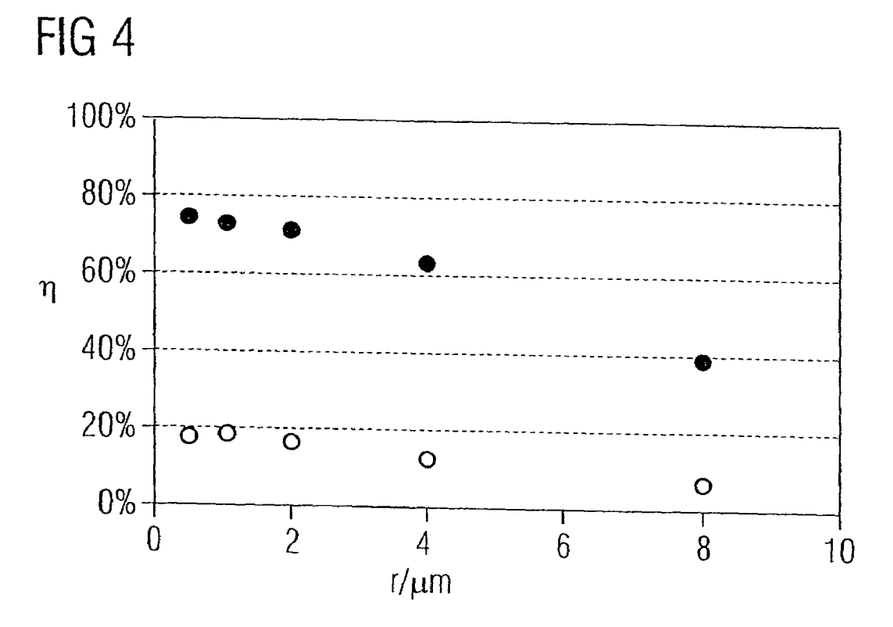
FIG. 4 shows a graphical plotting of the coupling-out efficiency against the radius of the radiation-emitting region for the second exemplary embodiment of the optoelectronic chip.

FIG. 4 shows calculated values of the coupling-out efficiency η as a function of the radius r of the radiation-emitting region 2 for an optoelectronic chip such as is described in the exemplary embodiment of FIG. 3. In this case, the following model parameters are kept constant:

the radius of the semiconductor sphere formed by convexly curved regions 3 and lens 12 is R=8 µm.

The thickness d of the connecting semiconductor layer is 2.2 µm, the thickness of the active zone 1 being 0.2 µm. The radiation-emitting region 2 has an internal efficiency for photon recycling of 90 percent and is formed in the AlGaInP semiconductor system defined above. The emission wavelength is 650 nanometers.

The refractive index of the semiconductor body in the AlGaAs/AlGaInP material system is approximately between 3.0 and 3.5. That is to say that the filler layers 4 are formed in the AlGaAs material system.

The refractive index of the material surrounding the chip is 1.5. This corresponds for example to the refractive index of epoxy resin, which may for example adjoin the surface 13 of the optoelectronic chip as chip encapsulation.

In this exemplary embodiment, the dielectric layer 6 comprises a silicon nitride. The metal layer 8 comprises gold.

Given a sphere radius of R=8 µm, the abovementioned Weierstrass condition means that the radius of the radiation-emitting region 2 should be restricted to at most 3.5 µm.

As can be gathered from FIG. 4, the coupling-out efficiency becomes all the greater, the smaller the radiation-emitting region is chosen to be. If the radius r of the radiation-emitting region 2 is restricted to 2 µm, that is to say given a lateral extent of the radiation-emitting region 2 of 4 µm, an integral coupling-out efficiency of approximately 75 percent may be achieved, by way of example.

Figure 5A:
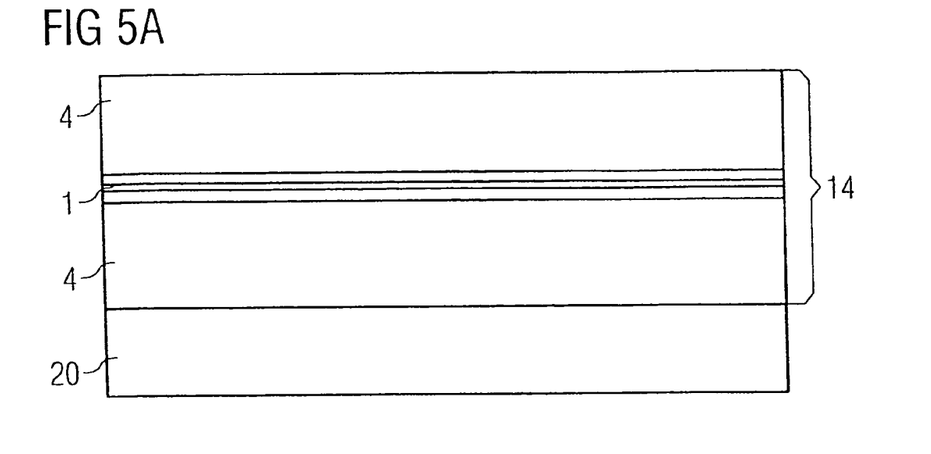
FIGS. 5A to 5H show schematic sectional illustrations of method steps for producing an optoelectronic chip described herein.

The optoelectronic chip as shown in FIG. 3, for example, may be produced as follows. Firstly, a semiconductor body 14 comprising filler layers 4 and active zone 1 is deposited epitaxially onto a growth substrate wafer (20) (in this respect, see FIG. 5A).

Figure 5B:
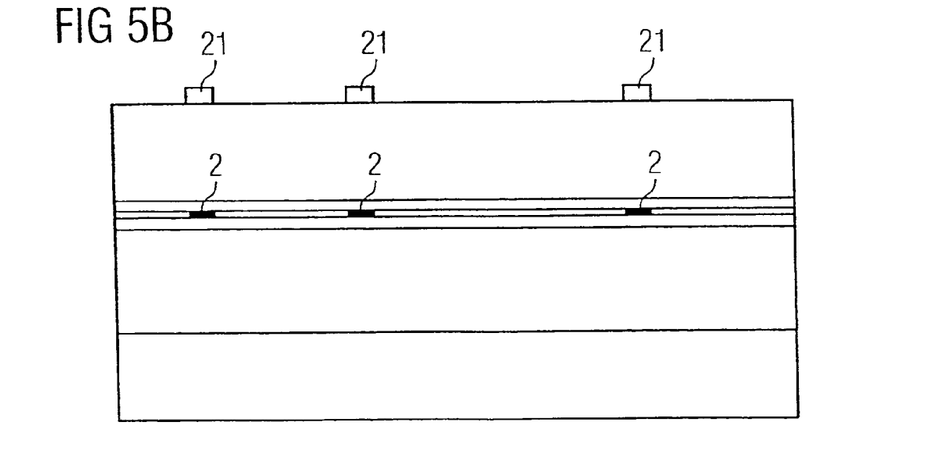

FIG. 5B shows how a mask is subsequently applied to the surface of the semiconductor body 14 remote from the substrate 20, which defines regions which are to be suitable for generating radiation. Regions that are not protected by the mask are damaged by means of proton implantation, by way of example, as a result of which radiation-generating regions 2 are defined in the active zone 1.

Figure 5C:
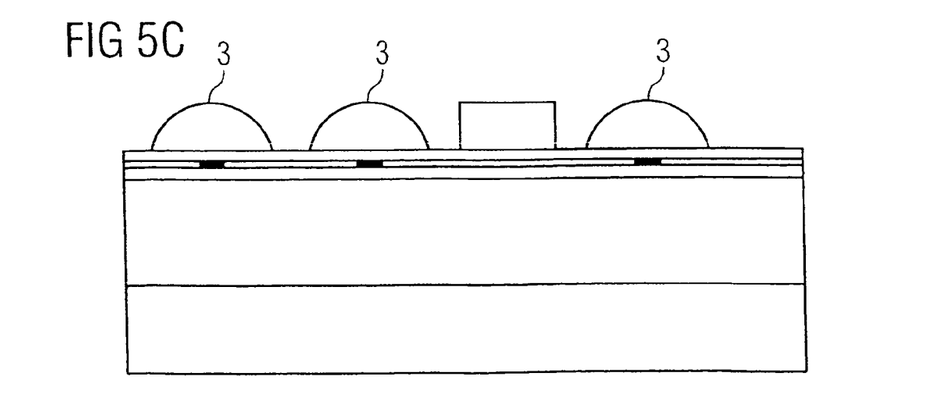

In a subsequent method step (FIG. 5C), the partial regions 3 which later face the carrier 10 are produced by means of etching. This is done for example when using photoresist rounded by a heat treatment step and subsequent dry etching. The rectangular structure depicted in FIG. 5C is part of the filler layer 4 and serves as a post for the application of a bonding pad 11.

Figure 5D:
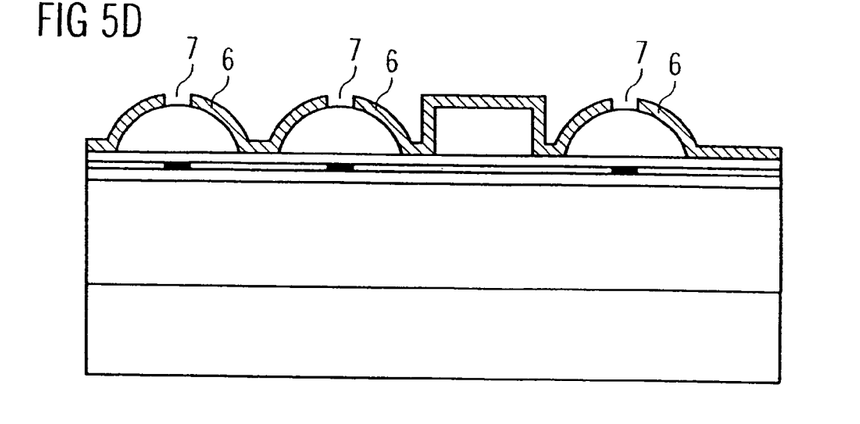

FIG. 5D shows how a dielectric layer 6, which may contain silicon nitride, by way of example, is subsequently applied to the partial regions 3. Above the radiation-emitting regions 2, the dielectric layer is opened by means of etching, by way of example, in order to produce current coupling-in regions 7 for later current injection.

Figure 5E:
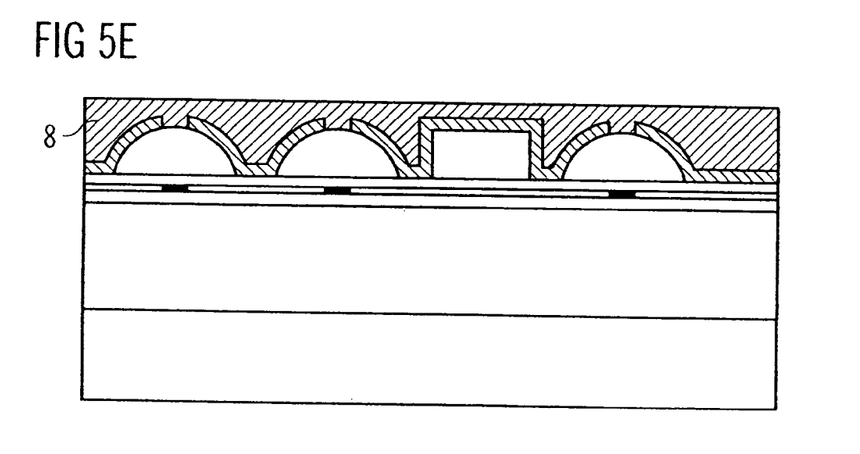

In a further method step (see FIG. 5E), a mirror and contact metalization—the metal layer 8—containing gold, by way of example, is applied.

Figure 5F:
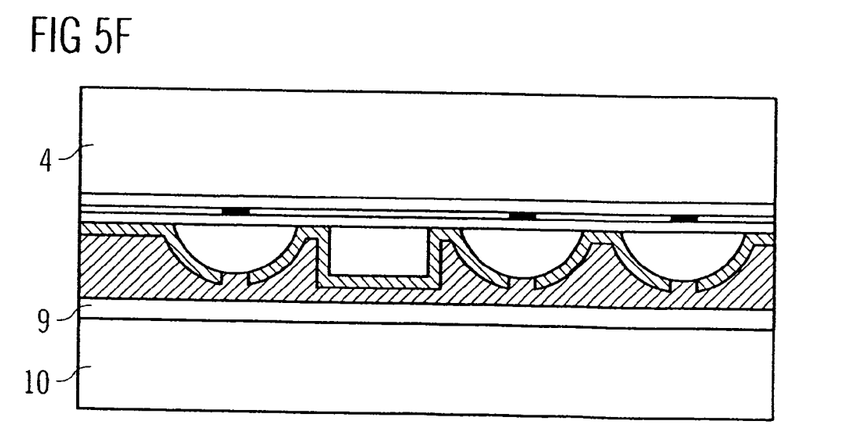

By means of a wafer bonding technique, by way of example, a carrier 10 is applied, with the aid of the bonding layer 9, to that surface of the semiconductor body 14 which is remote from the growth substrate 20, and the growth substrate 20 is subsequently removed (see FIG. 5F).

Figure 5G:
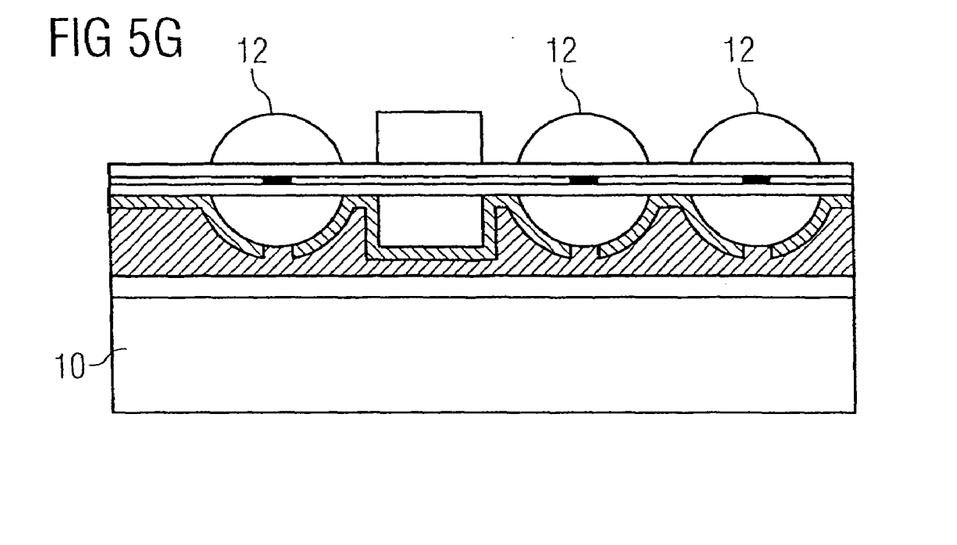

FIG. 5G shows how, analogously to the production of the partial regions 3, spherical structures—the lenses 12—are subsequently patterned into the filler layer 4 remote from the carrier 10 by means of a dry etching technique, by way of example.

Figure 5H:
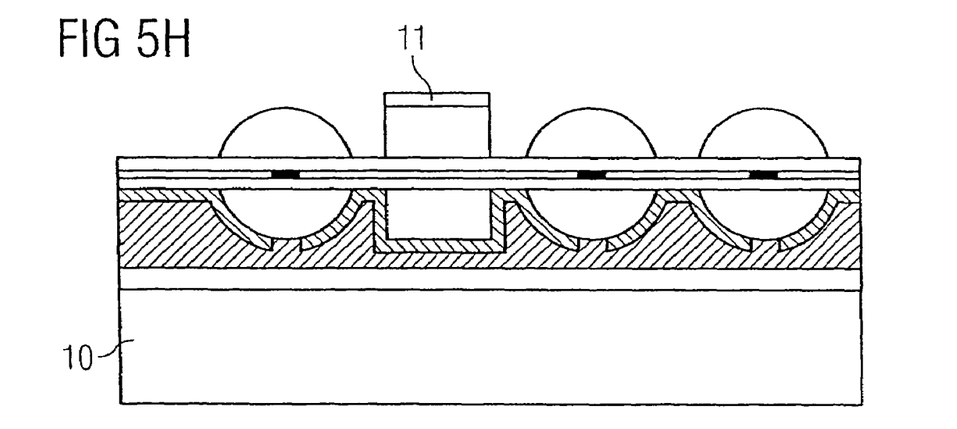

FIG. 5H shows the application of a bonding pad 11.

For the purpose of current distribution, it may furthermore be necessary to apply a contact grid or contact points connected by a TCO on the top side 13 of the semiconductor body 14. The contact regions that are metallic—and thus shield electromagnetic radiation—are preferably situated in trenches between the hemispheres forming the lenses 12 on the surface 13 of the semiconductor body 14 that is remote from the carrier 10.

In a final method step (not shown), contacts are alloyed and the wafer is segmented into individual chips. Each optoelectronic chip preferably comprises at least 80 radiation-emitting regions 2.

As an alternative, in the method described, the production of the radiation-emitting regions 2 may also be effected after the stripping away of the growth substrate 20. Moreover, besides proton implantation, it is also possible to use other techniques such as oxidation of a high-aluminum-containing AlGaAs layer or quantum well intermixing for producing the radiation-emitting regions 2.

If—as in the exemplary embodiment of FIG. 1, by way of example—no lenses 12 are formed on the surface 13 of the semiconductor body 14 that is remote from the carrier 10, then the production of radiation-emitting regions 2 may alternatively be obviated. By way of example, a semiconductor layer 5 is then used which has a sufficiently poor lateral current conduction. That is to say that the conductivity of the layer 5 is greatly restricted in a plane parallel to the surface of the carrier 10 that faces the semiconductor body 14. Contact points generated above the paraboids can be used in this case. On account of the small current expansion in the layer 5, this gives rise to radiation-emitting regions 2 in the active zone 1 whose lateral extent corresponds approximately to the lateral extent of the contact points. The radiation-emitting regions 2 are then approximately a perpendicular projection of the contact points into the plane of the active zone 1.

The invention is not restricted by the description on the basis of the exemplary embodiments. Rather, the invention encompasses any new feature and also any combination of features, which in particular comprises any combination of features in the patent claims, even if this feature or this combination itself is not explicitly specified in the patent claims or exemplary embodiments.

We claim:

1. An optoelectronic chip comprising:
   a semiconductor body with a radiation-emitting region; and
   a partial region forming part of the semiconductor body and including a surface of the semiconductor body curved convexly toward a carrier, the partial region comprising a semiconductor material;
   wherein a lateral extent of the radiation-emitting region is less than a lateral extent of the partial region, and
   wherein at least one part of the radiation-emitting region is arranged at a midpoint of a sphere which is formed by patterning a surface of the semiconductor body facing the carrier and remote from the carrier.

2. The optoelectronic chip as claimed in claim 1, in which at least one reflective layer is arranged between the semiconductor body and the carrier.

3. The optoelectronic chip as claimed in claim 2, in which the reflective layer covers the partial region at least in places.

4. The optoelectronic chip as claimed in claim 1, in which the semiconductor body has a multiplicity of radiation-emitting regions.

5. The optoelectronic chip as claimed in claim 4, in which the semiconductor body has a multiplicity of partial regions, each of which is assigned to one of the radiation-emitting regions.

6. The optoelectronic chip as claimed in claim 5, in which each of the multiplicity of partial regions is assigned one-to-one to each of the radiation-emitting regions.

7. The optoelectronic chip as claimed in claim 1, in which the partial region forms a concave mirror for an electromagnetic radiation generated by the radiation-emitting region.

8. The optoelectronic chip as claimed in claim 7, in which the radiation-emitting region is arranged, at least in places, in a focal plane of the concave mirror.

9. The optoelectronic chip as claimed in claim 1, in which the partial region has a parabolic curvature.

10. The optoelectronic chip as claimed claim 1, in which the partial region has a spherical curvature.

11. The optoelectronic chip as claimed in claim 1, in which the partial region has an aspherical curvature.

12. The optoelectronic chip as claimed in claim 1, in which a surface of the semiconductor body that is remote from the carrier has a region that is patterned in such a way that it forms a lens for an electromagnetic radiation generated by the radiation-emitting region.

13. The optoelectronic chip as claimed in claim 12, in which the lateral extent of the radiation-emitting region is less than a lateral extent of the lens.

14. The optoelectronic chip as claimed in claim 12, in which a plurality of lenses are formed, the semiconductor body has a plurality of radiation-emitting regions, and precisely one of the lenses is assigned to each of the radiation-emitting regions.

15. The optoelectronic chip as claimed in claim 14, in which each of the lenses is assigned one-to-one to each of the radiation-emitting regions.

16. The optoelectronic chip as claimed in claim 12, in which the lens is formed by a region of a surface of the semiconductor body that is curved convexly away from the carrier.

17. The optoelectronic chip as claimed in claim 16, in which the region of the surface of the semiconductor body that is curved convexly away from the carrier has a spherical curvature.

18. The optoelectronic chip as claimed in claim 16, in which the region of the surface of the semiconductor body that is curved convexly away from the carrier has an aspherical curvature.

19. The optoelectronic chip as claimed in claim 1, in which a surface of the semiconductor body that faces the carrier and a surface of the semiconductor body that is remote from the carrier have etched curved structures.

20. The optoelectronic chip as claimed in claim 1, in which a thickness of the semiconductor body is a maximum of 10 µm at its thinnest location.

21. The optoelectronic chip as claimed in claim 1, in which the semiconductor body is formed in AlGaAs/AlGaInP material system and the partial region is formed in AlGaAs material system.

22. The optoelectronic chip as claimed in claim 1, in which the semiconductor body is formed in AlGaAs/AlGaInP material system.

23. The optoelectronic chip as claimed in claim 1, in which the partial region is formed in AlGaAs material system.

* * * * *